United States Patent [19]
Tsuruta

[11] Patent Number: 5,994,914
[45] Date of Patent: Nov. 30, 1999

[54] SEMICONDUCTOR TESTING DEVICE WITH REDUNDANT CIRCUITS

[75] Inventor: Hiromi Tsuruta, Tokyo, Japan

[73] Assignee: NEC Corporation, Tokyo, Japan

[21] Appl. No.: 08/900,339

[22] Filed: Jul. 25, 1997

[30] Foreign Application Priority Data

Jul. 31, 1996 [JP] Japan .................................. 8-201988

[51] Int. Cl.⁶ ................................................. G01R 31/28
[52] U.S. Cl. ........................................... 324/765; 348/126
[58] Field of Search ................................ 324/765, 158.1, 324/752, 73.1; 348/126, 116, 145; 382/318

[56] References Cited

U.S. PATENT DOCUMENTS

| | | | |
|---|---|---|---|
| 4,736,159 | 4/1988 | Shiragasawa et al. | 324/752 |
| 4,761,607 | 8/1988 | Shiragasawa et al. | 324/765 |
| 4,965,515 | 10/1990 | Karasawa | 324/73.1 |
| 5,436,559 | 7/1995 | Takagi et al. | 324/756 |

FOREIGN PATENT DOCUMENTS

| | | |
|---|---|---|
| 61-28809 | 2/1986 | Japan . |
| 63-237432 | 10/1988 | Japan . |
| 1-260697 | 10/1989 | Japan . |
| 3-174738 | 7/1991 | Japan . |
| 6-181244 | 6/1994 | Japan . |
| 6-302777 | 10/1994 | Japan . |
| 07142547 | 6/1995 | Japan . |

Primary Examiner—Josie Ballato
Assistant Examiner—Minh Tang
Attorney, Agent, or Firm—Whitham, Curtis & Whitham

[57] ABSTRACT

In a semiconductor testing device, the defective data of a semiconductor device which is detected by a defective detection unit 1 are converted to address data on the basis of inherent information such as the cell size, the divisional size, etc. of the semiconductor device by an address conversion unit 2, and the address data are compared with a redundant circuit area of the semiconductor device to make a quality (defective or non-defective) judgment of the semiconductor device by a judgment unit 3, whereby when any defective exists in the semiconductor device, the judgment as to whether the defective is replaceable (relievable) by the redundant circuits can be more accurately performed.

7 Claims, 4 Drawing Sheets

SEMICONDUCTOR TESTING DEVICE WITH REDUNDANT CIRCUITS

BACKGROUND OF THE INVENTION

1. Field of the Invention

The present invention relates to a semiconductor testing device, and particularly to a semiconductor testing device for testing a semiconductor device using redundant circuits.

2. Description of the Related Art

In a conventional semiconductor testing device, a laser beam is irradiated onto a semiconductor device to test the semiconductor device by scattered light or pattern comparison or the like, and if any defective (e.g., defect chip) is detected through the testing, the quality of the device is judged on the basis of the number of defectives (defects chips).

However, when a semiconductor device having redundant circuits is tested, it is necessary that defects which can be relieved by the redundant circuits and defects which cannot be relieved by the redundant circuits are discriminated from one another and then the test result is considered on the basis of the discrimination.

A testing method for a semiconductor device having redundant circuits is disclosed in Japanese Laid-open patent Application No. Hei-7-142547. FIG. 4 is a diagram showing a testing method of a semiconductor testing device disclosed in Japanese Laid-open Patent Application No. Hei-7-142547.

As shown in FIG. 4, according to the conventional semiconductor device testing device, chips on the same device are visually inspected to find out defective chips in each of manufacturing processes A, B and C, and the chip coordinates of the defective chips are collected (step S21). The number of type-basis replacement usage of redundant circuits in each manufacturing process, which is obtained by replacing the redundant circuits for a defective chip, is determined (step S22). As a result of the visual inspection of all the manufacturing processes on the same device, the type-basis replacement usage number of the redundant circuits is accumulated for every same device to calculate the accumulated value of the redundant circuits on a type basis (step S23). The defectiveness or non-defectiveness is judged on the basis of a judgment as to whether the added accumulated value (total value) exceeds a preset limit value (step S24). If the accumulated value is judged to exceed at least one type-basis limit value, the testing of the chip concerned is omitted. If the accumulated value is judged not to exceed the limit value, the chip concerned is judged to be a non-defective chip which can be relieved by the redundant circuits, and thus the chip is transferred to a chip test process.

In a recent semiconductor device having redundant circuits, in most cases, not only the total usage number is determined, but also the usage number is determined in every area of a chip. Accordingly, it is necessary to make a judgment as to whether the defect (e.g., chip) is relievable or irrelievable in consideration of the device information.

However, in the prior art as described above, the usage number of redundant circuits is determined every same device, and it is judged on the basis of the usage number whether the defect of the device is relievable or irrelievable. Therefore, the prior art has a problem that the yield cannot be accurately estimated.

SUMMARY OF THE INVENTION

An object of the present invention is to provide a semiconductor testing device which can perform an accurate yield estimation on a semiconductor device having redundant circuits.

In order to attain the above object, a semiconductor testing device for performing a quality (good or bad) judgment on a semiconductor device having redundant circuits, is characterized by comprising defective detection means for detecting a defect of the semiconductor device and outputting the detection result as defective data, and judgment means for comparing the defective data with a redundant circuit area of the semiconductor device to perform the quality judgment of the semiconductor device.

Further, the semiconductor testing device further comprises address conversion means for receiving the defective data and inherent information of the semiconductor device and converting the defective data to address data on the basis of the inherent information and outputting the address data, wherein the judgment means compares the address data with the redundant circuit area of the semiconductor device to perform the quality judgment of the semiconductor device.

Still further, in the semiconductor testing device, the inherent information is information on the cell size and divisional size of the semiconductor device.

Still furthermore, a semiconductor testing device for making a quality judgment of a semiconductor device having redundant circuits is characterized by comprising visual inspection means for visually inspecting each cell in the semiconductor device, defective detection means for detecting a cell having a defect by said visual inspection unit and outputting the detection result as defective data, and judgment means for comparing the defective data with a redundant circuit area of the semiconductor device to make the quality judgment of the semiconductor device.

According to the present invention, the defective data of the semiconductor device which are detected by the defective detection means are converted to the address data on the basis of the cell size and the divisional size of the semiconductor device in the address conversion means, and the address data and the redundant circuit area of the semiconductor device are compared in the judgment means to perform the quality judgment of the semiconductor device. Therefore when any defect exists in the semiconductor device, it can be accurately judged whether the defect can be replaced by a redundant circuit.

BRIEF DESCRIPTION OF THE DRAWINGS

FIGS. 3a to 3c are a diagram showing an example of a test result which is obtained by using the semiconductor testing device shown in FIG. 1, wherein FIG. 3a shows defective data detected by a defective testing unit, FIG. 3b is a diagram showing device information of a chip shown in FIG. 3a, and FIG. 3c is a diagram showing address data on the device to which the defective data shown in FIG. 3a are converted.

DETAILED DESCRIPTION OF THE PREFERRED EMBODIMENT

A preferred embodiment according to the present invention will be described with reference to the accompanying drawings.

Figure 1:
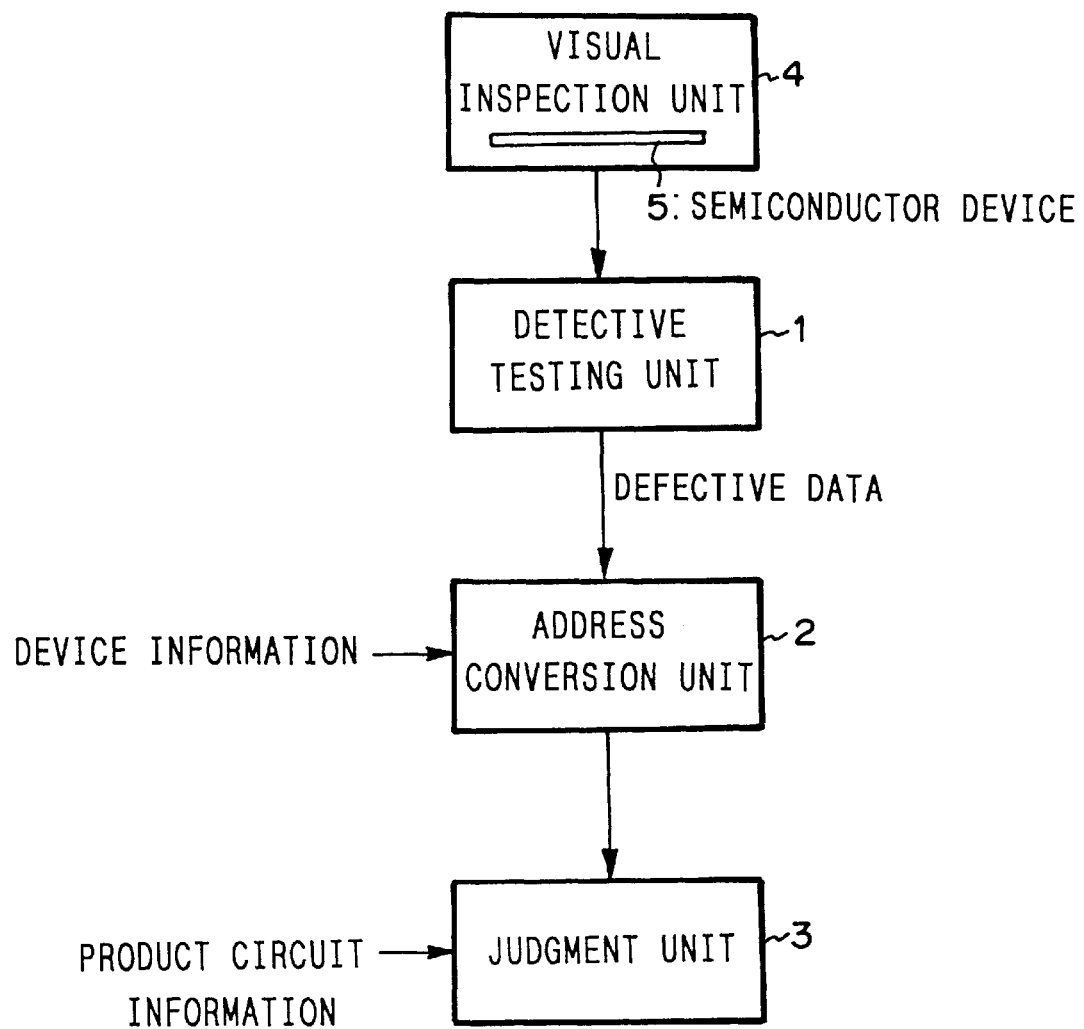
FIG. 1 is a block diagram showing the construction of an embodiment of a semiconductor testing device according to the present invention.

FIG. 1 is a block diagram showing the construction of an embodiment of a semiconductor testing device according to the present invention.

As shown in FIG. 1, the semiconductor testing device of this embodiment comprises a visual inspection unit 4 for visually inspecting plural chips of a semiconductor device 5 which is a test target, a defective detection unit 1 for detecting defects of the semiconductor device 5 and outputting the detection result as defective data, an address conversion unit 2 for receiving the defective data output from the defective detection unit 1 and inherent information of the cell size, the divisional size, etc. of the semiconductor device 5 to convert the physical data of the defective of the semiconductor device 5 to the address data on the basis of the input inherent information and output the address data, and a judgment unit 3 for receiving the address data output from the address conversion unit 2 and the information on the number of redundant circuits of each area which corresponds to product circuit information of the semiconductor device 5, and judging on the basis of the input information whether the defect in the semiconductor device 5 is replaced (relievable).

The defective data which are detected in the defective testing unit 1 has information on the relative distance from the origin on the chip and the size. The semiconductor device having the redundant circuits is a memory having plural memory cells. The memory cell is a storage element for storing 1 bit and serves as the minimum storage unit. The number of redundant circuits normally is set so that they are replaceable in accordance with column and row or every block.

Further, the size of the memory cells and the block in which the memory cells are arranged may be varied in accordance with semiconductor device 5. As the semiconductor device may be used DRAM, SRAM, a flash-memory, EEPROM, cache memory, ASIC, DSP or the like.

On the basis of the formation and the defective information of each of semiconductor devices, the physical data of the defect are converted to address data of the memory cell.

The operation of the semiconductor testing device thus constructed will be described.

Figure 2:
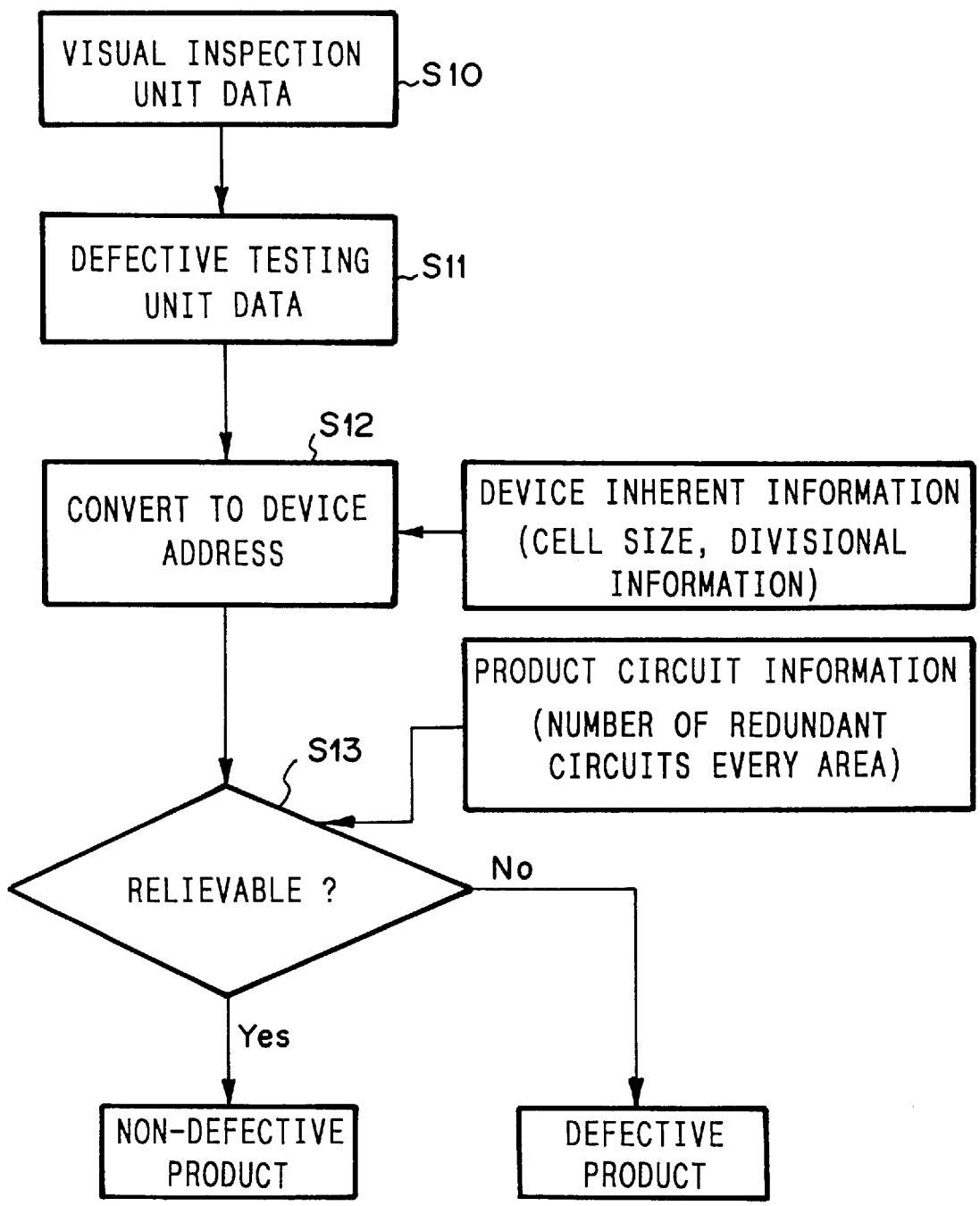
FIG. 2 is a diagram showing the operation of the semiconductor testing device shown in FIG. 1.

FIG. 2 is a diagram showing the operation of the semiconductor testing device shown in FIG. 1.

As a visual inspection testing system, a pattern of a semiconductor device 5 under test is read out by an image sensor, and then the pattern data thus obtained are compared with reference image data of a normal semiconductor device pattern in the visual inspection unit 4 to detect the different portions between the pattern data of the semiconductor device 5 under test and the reference pattern data of the normal semiconductor device, and then the coordinate data of the different portions are output as defective data. As another visual inspection testing system, the patterns of three chips which are designed to have the same pattern in a semiconductor device 5 under test are read out by photoelectric conversion means such as a CCD or the like, and then if the pattern of at least one chip is different among the three chips, it would be judged that a defective exists. The defective of the semiconductor device 5 is detected in the defective testing unit 1, and the defection result is output as defective data to the address conversion unit 2 (step S11).

The defective data are input to the address conversion unit 2, and the inherent information of the semiconductor device 5 such as the cell size, the divisional size, etc. is input to the address conversion unit 2, and the physical data of the defect of the semiconductor device 5 are converted to the address data on the basis of the input inherent information in the address conversion unit 2, and then input to the judgment unit 3 (step S12).

Thereafter, the address data of the defective portion are input to the judgment unit 3, and the information on the number of redundant circuits every area which is the product circuit information of the semiconductor device 5 is also input to the judgment unit 3. In the judgment unit 3, it is judged whether the defect in the semiconductor device is replaceable (relievable) (step S13). If the defective is replaceable (relievable), it is judged as being good (non-defective), and on the other hand, if the defect is not replaceable (relievable), it is judged as being bad (defective).

Next, the test result of the semiconductor testing device shown in FIG. 1 will be described with reference to FIGS. 3a to 3c.

Figure 3A:
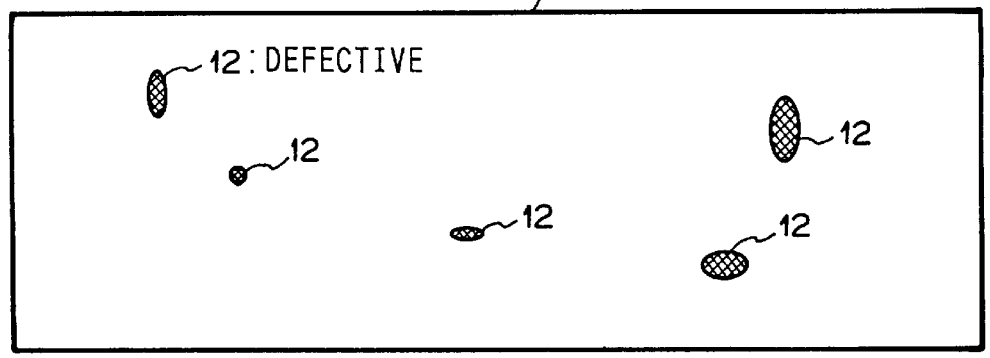
Figure 3B:
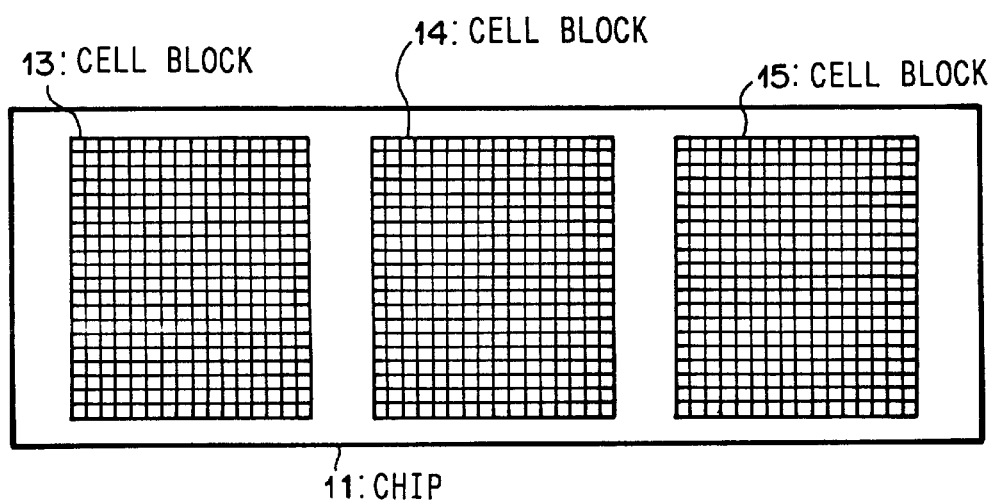
Figure 3C:
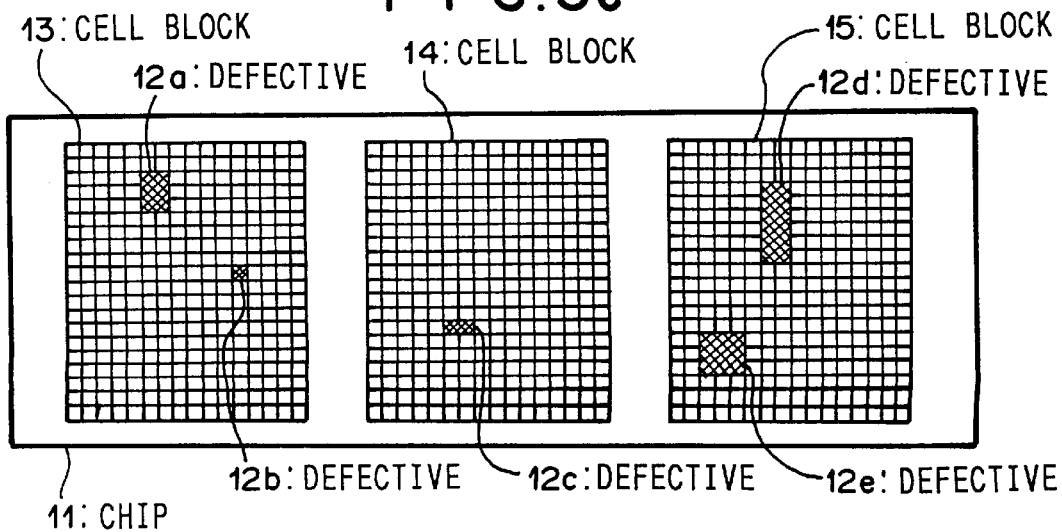
Figure 4:
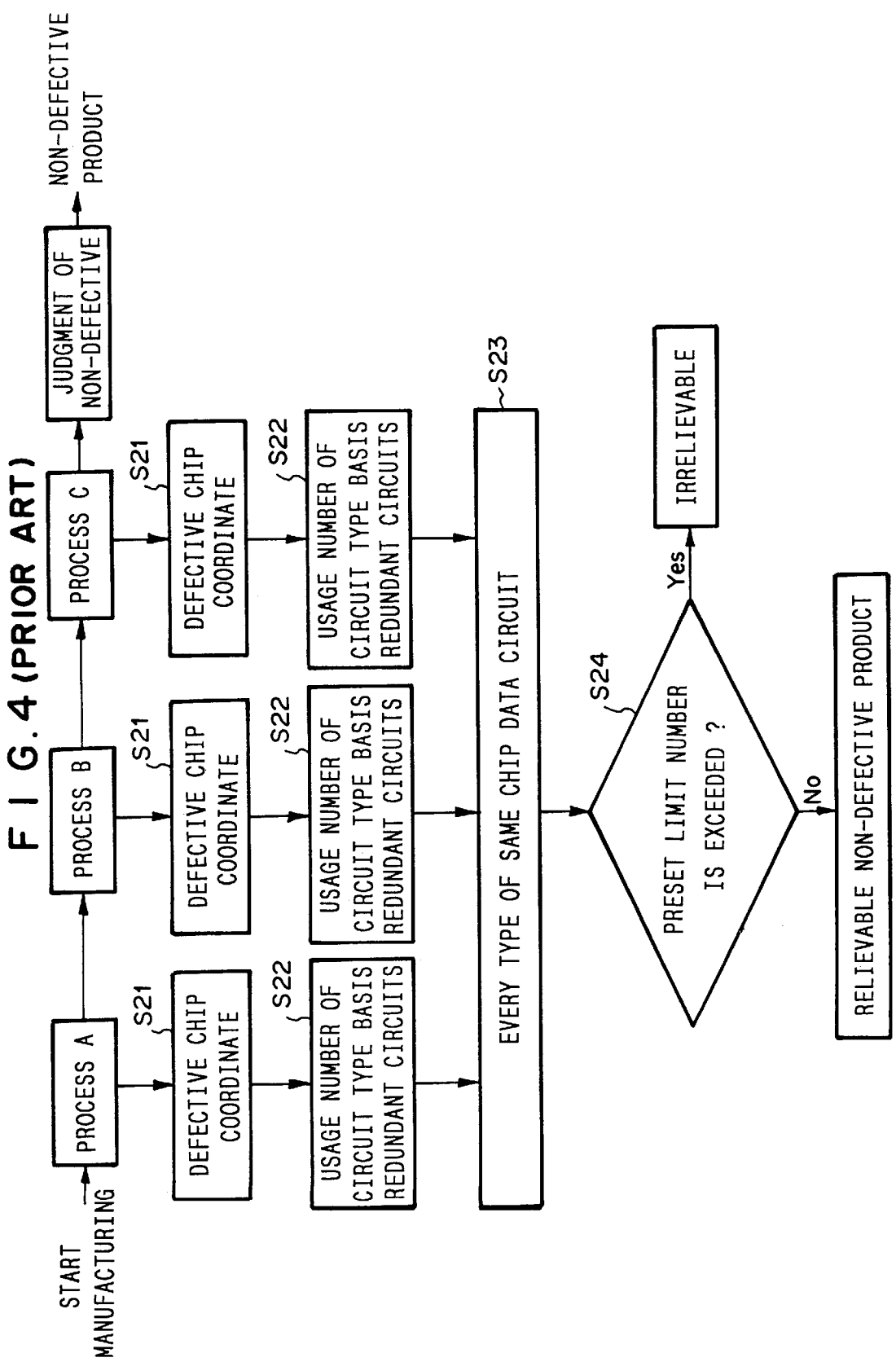
FIG. 4 is a diagram showing a testing method in the semiconductor testing device disclosed in Japanese Laid-open Patent Application No. Hei-7-142547.

FIGS. 3a to 3c show the test result obtained by using the semiconductor testing device shown in FIG. 1. In FIG. 3a shows the defective data detected by the defective testing unit, FIG. 3b shows the inherent information which is the device information of the chip shown in FIG. 3a, and FIG. 3c shows the address data on the device to which the defective data shown in FIG. 3a are converted. In FIG. 3b, each cell block 13, 14, 15 is illustrated as being divided into 16×20 cells, and an example of 3-divisional size is shown.

As shown in FIG. 3a, it is assumed that plural defects 12 on a chip 11 are detected in the defective detection unit 1. Each of the defects 12 has information on the distance from any origin on the chip and the size thereof. In the case where the defects are represented by coordinates, the defective data may be represented by the coordinates of defects, for example, (x1,y1) or (x2,y2).

Further, as show in FIG. 3b, the chip 11 has three cell blocks 13 to 15, and each block has a matrix-shaped (grip type) cell array.

Therefore, by combining the defective data shown in FIG. 3a and the information shown in FIG. 3b, the information on the arrangement of the cell array is obtained.

As shown in FIG. 3c, on the chip 11, a defect 12a is located over two columns×three rows and a defect 12b is located over one column×one row in the cell block 13, a defective 12c is located over two columns×one row in the cell block 14, and a defect 12d is located over two columns× six rows and a defect 12e is located over three columns× three rows in the cell block 15.

Here, when the device has a replacing circuit of 2 columns×2 rows as a redundant circuit, only the defects 12b and 12c can be replaced. Accordingly, the cell blocks 13 and 15 are judged as a defective, and the cell block 14 is judged as a non-defective.

Further, even when the permissible degree of the replacing circuit is varied every block of the inherent information, the present invention is applicable to such a case. For example, when the replacing circuit is composed of 3 columns×3 rows in the cell block 13, 2 columns×2 row in the cell block 14 and 2 columns×4 rows in the cell block 15, only the cell block 15 is judged as a defect, and the cell blocks 13 and 14 are judged as a non-defect.

As described above, in the address conversion means, the defective data of the semiconductor device detected by the defective detection means are converted to the address data on the basis of the inherent information such as the cell size, the divisional size, etc. of the semiconductor device, and in the judgment means the address data are compared with the redundant circuit area of the semiconductor device to make the quality (defective or non-defective) judgment of the semiconductor device. Therefore, when any defect exists in the semiconductor device, the judgment as to whether the defective is replaceable (relievable) by the redundant circuits can be more accurately performed.

Accordingly, an accurate yield estimation on semiconductor devices having redundant circuits can be made on the basis of the number of non-defective (good) chips on a wafer.

Although the present invention has been shown and described with respect to best mode embodiments thereof, it should be understood by those skilled in the art that the foregoing and various other changes, omission, and addition in the form and detail thereof may be made therein without departing from the spirit and scope of the present invention.

What is claimed is:

1. A semiconductor testing device for performing a quality judgment on a semiconductor device having redundant circuits, comprising:

a visual inspector for visually inspecting plural chips of the semiconductor device with a redundant circuit area;

defective detection means for detecting a defect of the semiconductor device and outputting the detection result as defective data; and judgment means for comparing the defective data with the redundant circuit area of the semiconductor device to perform the quality judgment of the semiconductor device.

2. A semiconductor testing device for performing a quality judgment on a semiconductor device having redundant circuits, comprising;

defective detection means for detecting a defect of the semiconductor device and outputting the detection result as defective data;

address conversion means for receiving the defective data and inherent information of the semiconductor device and converting the defective data to address data on the basis of the inherent information and outputting the address data; and judgment means for comparing the address data with a redundant circuit area of the semiconductor device to perform the quality judgment of the semiconductor device, and wherein the semiconductor device is judged defective when a size of the defective data converted to the address data associated with the semiconductor device is larger than the redundant circuit area.

3. The semiconductor testing device as claimed in claim 2, wherein the inherent information is information on the cell size and divisional size of the semiconductor device.

4. A semiconductor testing device for making a quality judgment of a semiconductor device having redundant circuits, comprising:

visual inspection means for visually inspecting each cell in the semiconductor device with a redundant circuit area;

defective detection means for detecting a cell having a defect by said visual inspection means and outputting the detection result as defective data; and judgment means for comparing the defective data with the redundant circuit area of the semiconductor device to make the quality judgment of the semiconductor device.

5. The semiconductor testing device as claimed in claim 4, wherein each of said redundant circuits is specified on the basis of the column and row indicating each cell every block of the semiconductor device.

6. The semiconductor testing device as claimed in claim 5, further comprising conversion means for converting the defective data to address data, and judgment means for comparing the address data with a redundant circuit area of the semiconductor device to detect a defective chip of the semiconductor device.

7. A semiconductor testing device for making a quality judgment of a semiconductor device having redundant circuits, comprising;

visual inspection means for visually inspecting each cell in the semiconductor device;

defective detection means for detecting a cell having a defect by said visual inspection means and outputting the detection result as defective data;

conversion means for converting the defective data to address data, wherein said defective detection means further compares the address data with the redundant circuit area of the semiconductor device to detect a defective chip of the semiconductor device; and judgment means for comparing the address data with a redundant circuit area of the semiconductor device to make the quality judgment of the semiconductor device, wherein the semiconductor device is judged defective when a size of the defective data converted to the address data associated with the semiconductor device is larger than the redundant circuit area.

* * * * *